United States Patent [19]
Nguyen et al.

[11] Patent Number: 5,539,336
[45] Date of Patent: Jul. 23, 1996

[54] HIGH SPEED DRIVER CIRCUIT WITH IMPROVED OFF TRANSITION FEEDBACK

[75] Inventors: Trung Nguyen, San Jose; George Shing, Fremont; Luong Hung, Cupertino; Gary H. Cheung, Fremont; Elias Lozano, San Jose, all of Calif.

[73] Assignee: LSI Logic Corporation, Milpitas, Calif.

[21] Appl. No.: 432,358

[22] Filed: May 1, 1995

[51] Int. Cl.$^6$ .................. H03K 19/0175; H03K 17/16
[52] U.S. Cl. .................. 326/83; 326/27; 326/16; 326/17
[58] Field of Search .................. 326/27, 17, 83, 326/16, 57

[56] References Cited

U.S. PATENT DOCUMENTS

| | | | |
|---|---|---|---|
| 4,961,010 | 10/1990 | Davis | 326/57 |
| 5,194,764 | 3/1993 | Yano et al. | 326/27 |
| 5,315,174 | 5/1994 | Chang et al. | 326/27 |
| 5,438,278 | 8/1995 | Wong et al. | 326/27 |

*Primary Examiner*—Edward P. Westin
*Assistant Examiner*—Richard Roseen
*Attorney, Agent, or Firm*—Townsend and Townsend and Crew; Henry K. Woodward

[57] ABSTRACT

A driver circuit has a single feedback transistor in the driver transistor well to provide a momentary feedback from source to gate and maintain conductance of the driver transistor during turnoff of the driver transistor and thus reduce ringing oscillation at the transistor source output. An enable/disable signal is applied to control conduction circuitry and the driver transistor and force the output to a high impedance state when the circuit is disabled. Clocked operation of the driver circuit is provided with circuitry merged with a latch. A terminal for receiving a global $i_{dd}$ test signal controls circuitry removing power to the driver circuit and applying a ground potential to the driver output in response to the global $i_{dd}$ test signal.

15 Claims, 4 Drawing Sheets

HIGH SPEED DRIVER CIRCUIT WITH IMPROVED OFF TRANSITION FEEDBACK

BACKGROUND OF THE INVENTION

This invention relates generally to driver circuitry for use in high speed logic circuits, and more particularly the invention relates to a driver circuit with improved feedback to facilitate an off transition without ringing.

FIG. 1 is a schematic of a conventional high speed driver circuit for use in high speed logic circuits operating up to 100 MHz and higher. To assist in turning N channel driver transistor 10 off without ringing in response to a positive signal applied to the input of inverter 12, N channel transistors 14, 16 serially provide a feedback from the source of transistor 10 to the gate of transistor 10. Both transistors are momentarily on when the inverter 12 input switches from low to high due to transistor 16 being immediately turned on by the input and transistor 14 being delayed in turning off due to the delay in serial inverters 18, 20 which connect the output of inverter 12 to the gate of transistor 14. This momentary feedback reduces ringing oscillation at the output node Z when transistor 10 is turned off and by maintaining some conduction of the driver transistor during the transition.

Unfortunately, the feedback transistors 14, 16 must be placed in the driver transistor well 11 in the semiconductor chip, thus reducing the area available for the driver transistor or else requiring a larger well size. Further, the driver does not have a global set signal for a high impedance state at the output Z; in order to put the Z bus in a high impedance state, additional logic must be provided in front of the driver. This adversely affects circuit size and speed of operation. Additionally, the driver always draws $i_{dd}$ current.

The present invention is directed to an improved driver circuit which overcomes these limitations in the prior art driver.

SUMMARY OF THE INVENTION

In accordance with the invention, a driver circuit includes enable logic at the input of the circuit to place the driver output in a high impedance state and also control a single feedback for the driver transistor when the driver is enabled. The feedback transistor is controlled by the enable signal and by an input signal to suppress ringing when the output state goes to a high output or a high impedance state. The enable logic can also enable and disable a clock input to the driver and set a latch on the driver input.

In a preferred embodiment, a first pass gate and a first inverter connect an input to the gate of the driver transistor. An enable input controls conduction of the first pass gate and can latch the driver transistor off for a high impedance state. The output of the first pass gate is passed through a second pass gate to the gate of the feedback transistor connected between the source and gate of the driver transistor. The output of the first inverter is connected through additional inverters to the gates of the second pass gate transistors. Thus, an input transition from low to high is momentarily applied to the feedback transistor until the second pass gate is turned off. Additional circuitry is provided for removing all d.c. current from the driver circuitry in response to a global signal for $i_{dd}$ test.

The invention and objects and features thereof will be more readily apparent from the following detailed description and appended claims when taken with the drawing.

DETAILED DESCRIPTION OF ILLUSTRATIVE EMBODIMENTS

Figure 1:
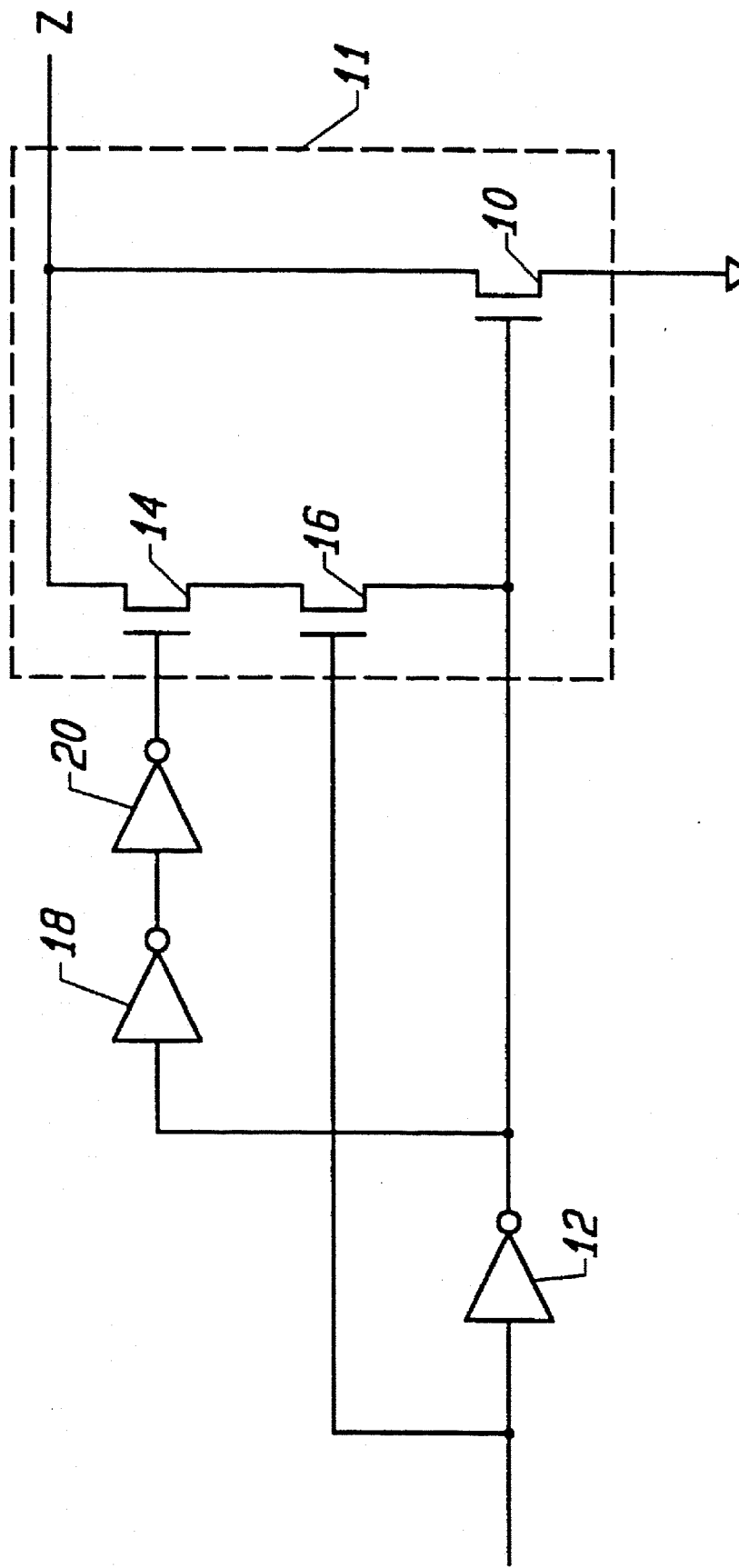
FIG. 1 is a schematic of driver circuitry in accordance with the prior art.
Figure 2:
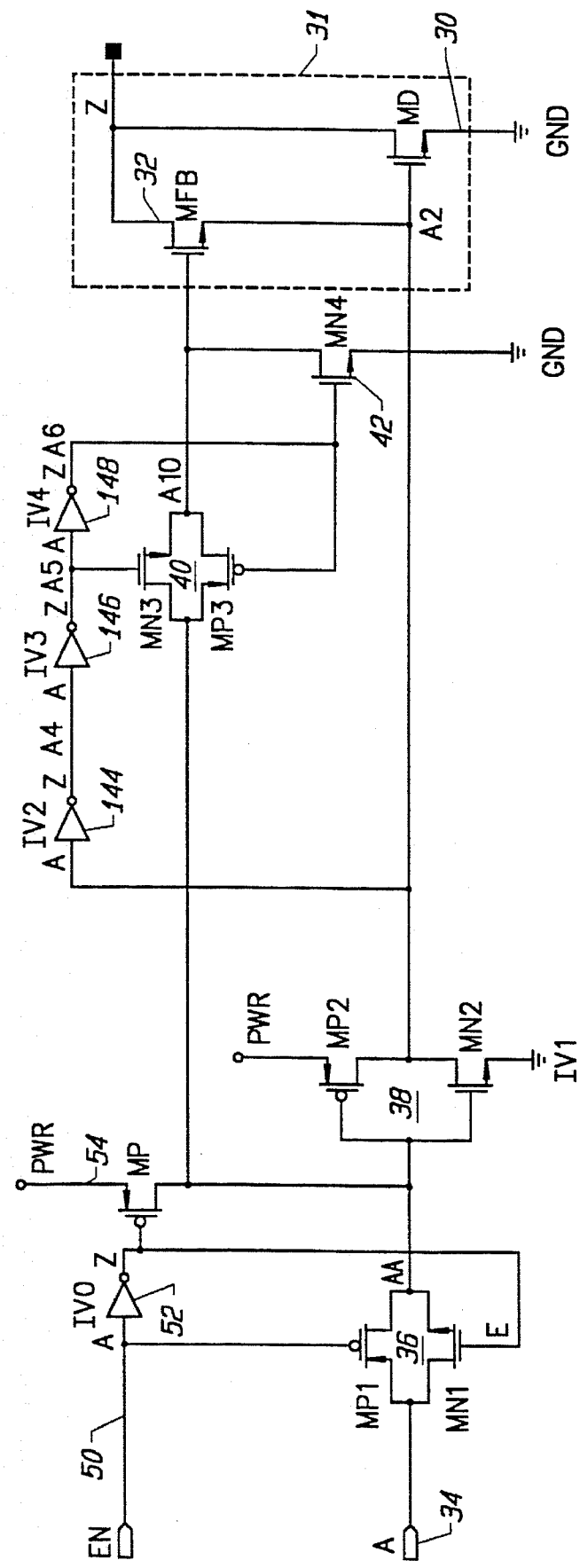
FIG. 2 is a schematic of driver circuitry in accordance with one embodiment of the invention.

FIG. 2 is a schematic of a driver circuit in accordance with one embodiment of the invention. The driver transistor 30 is formed in a well 31 along with a single feedback transistor 32 which interconnects the output Z and the source of transistor 30 to the gate of transistor 30. The input signal at terminal 34 is connected through pass gate 36 and a first inverter 38 to the gate of driver transistor 30. The output of pass gate 36 is also connected through a second pass gate 40 to the gate of feedback transistor 32. Transistor 42 connects the output of pass gate 40 and the base transistor 32 to ground. Bias for the pass gate 40 and transistor 42 is obtained from the output of inverter 38 through serially connected inverters 44, 46, 48. Thus, an inverted input signal at the output of inverter 38 is applied through inverters 44, 46 as the gate bias for the N channel transistor of pass gate 40, and is further inverted by inverter 48 and applied as the gate bias for the P channel transistor of pass gate 40 and the gate bias for N channel transistor 42. Temporary conduction of transistor 32 suppresses ringing at the output when the circuit is disabled and when the circuit is enabled and the input switches from low to high, as described below.

Operation of the driver circuit of FIG. 2 is enabled and disabled by a signal at terminal 50. When the enable signal is a "zero," pass gate 36 is conductive as the zero or low voltage of the enable signal is applied to the gate of P channel transistor of the pass gate 36 and the inverted input signal from inverter 52 is applied as the gate bias on the N channel transistor of pass gate 36. A P channel transistor 54 is controlled by the output of inverter 52, and when the enable input is high (disable signal), inverter 52 biases transistor 54 on which passes a low voltage through the inverter 38 to the gate of transistor 30, thereby preventing conduction of transistor 30.

When the driver circuit is enabled and the input signal at terminal 34 is at a low state, pass gate 40 is conductive and feedback transistor 32 is off. When the input signal at terminal 34 switches from low to high, the bias on the gate of feedback transistor 32 immediately goes high and transistor 32 momentarily provides a feedback path from the source to gate of transistor 30. About one nanosecond later, the rising edge of the input signal at terminal 34 travels through inverters 38, 44, 46, 48 to turn off the transistors of pass gate 40 and turn on transistor 42 thereby pulling the gate of transistor 32 low and turning off transistor 32. With high to low transition at the input terminal 34, the gate of transistor 32 is maintained at a low level and the feedback remains off during this transition. However, the momentary turn on of feedback transistor 32 for low to high transitions at the input terminal maintains the driver transistor 30 slightly conductive during the off transition to reduce noise at the output Z due to ringing oscillations.

Thus, the circuit of FIG. 2 maintains the feedback function of the prior art in preventing ringing oscillations when the driving transistor is turned off by providing a single feedback transistor 32 in the well 31 with the driving transistor 30. An enable signal is included in the pre-driver logic circuitry which can put the driver in a disabled or high impedance state.

Figure 3:
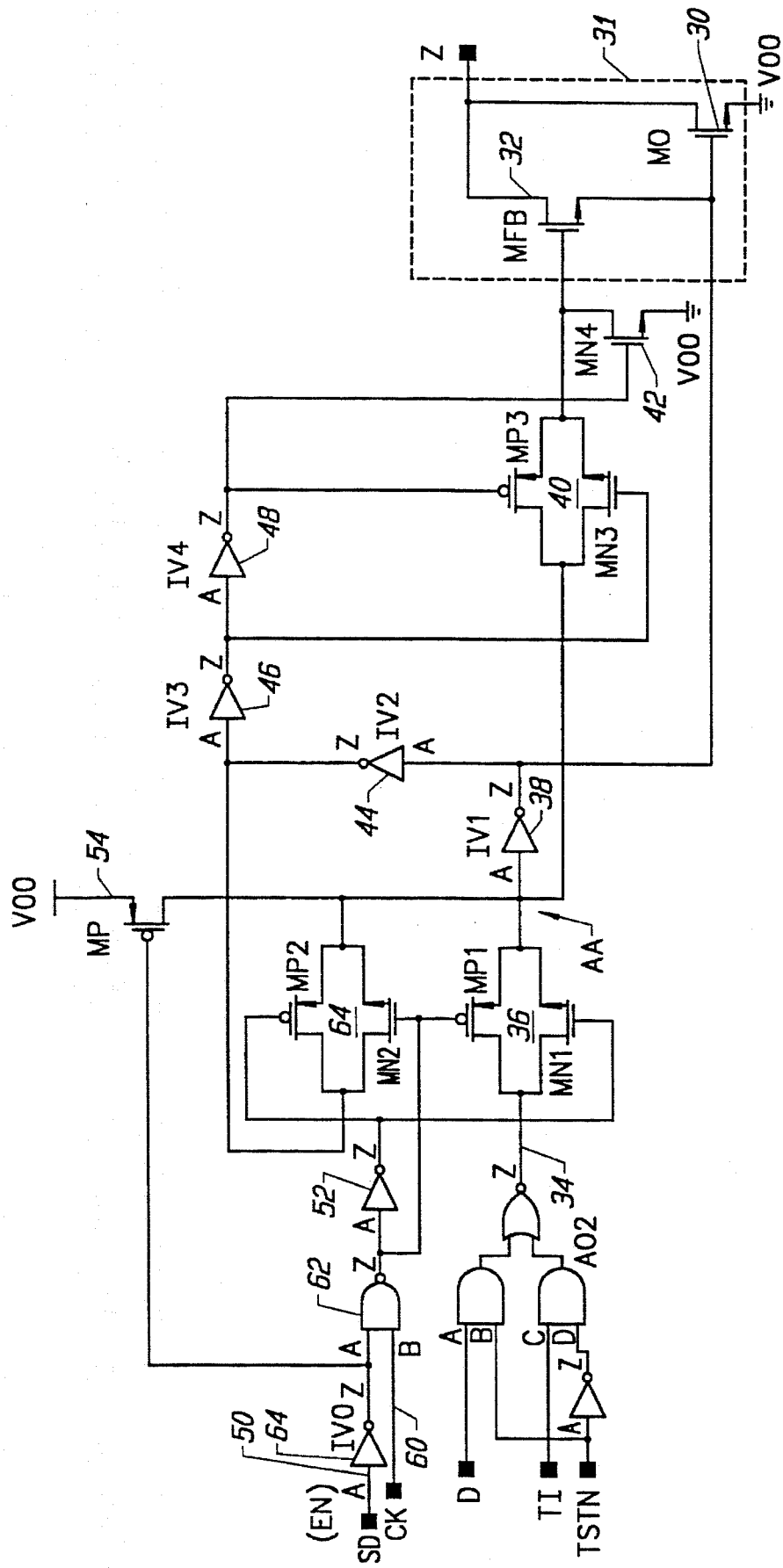
FIG. 3 is a schematic of the driver circuitry of FIG. 2 and including clock enable/disable circuitry in accordance with another embodiment of the invention.

FIG. 3 is another embodiment of the invention which is similar to the driver circuit of FIG. 2, and like elements have the same reference numerals. In FIG. 3 a registered or clocked operation is provided which allows a scan latch to merge into the driver and reduce the clock to driver output delay. The clock signal 60 and the enable signal 50 are applied as inputs to NAND gate 62, the enable signal passing through inverter 64 to one input of NAND gate 62. When the enable signal 50 is low, the driver circuit operates under normal conditions with the clock passing through NAND gate 62. However, when the enable signal is high, the clock signal cannot pass through the NAND gate 62, and transistor 54 pulls the output of pass gate 36 high to set the latch. The high voltage from transistor 54 is passed through pass gate 64 to turn off pass gate 40.

Figure 4:
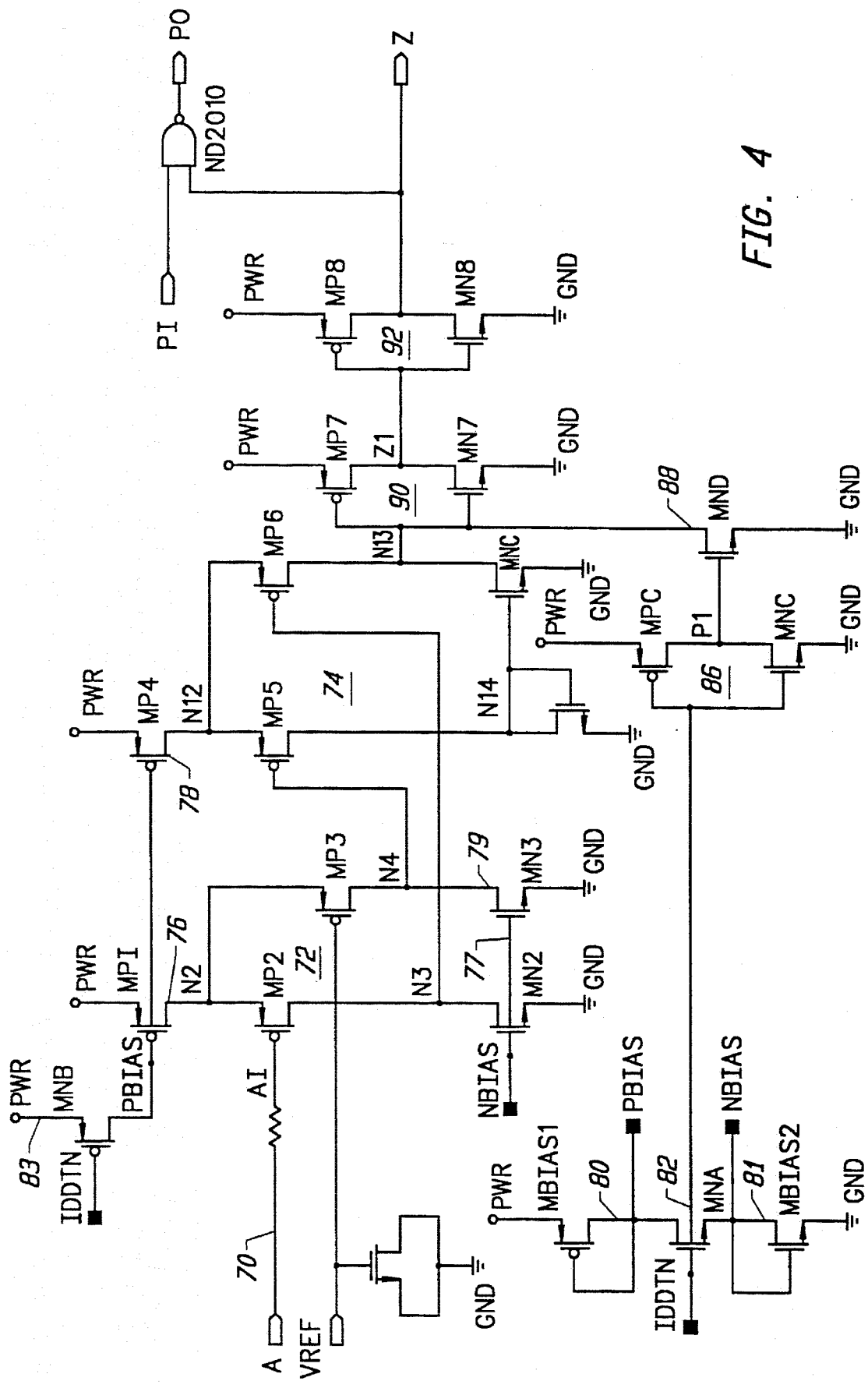
FIG. 4 is a schematic of circuitry for removing all d.c. current from the driver for $i_{dd}$ test in accordance with another embodiment of the invention.

FIG. 4 is another embodiment of the invention which introduces a global signal ($i_{ddtn}$) to remove all d.c. current in the receiver for an $i_{dd}$ test. The input at 70 passes through a first differential stage 72 and a second differential stage 74 which are respectively connected between the power source and ground by P channel transistors 76, 78 and the N channel transistors 77, 79, which are respectively biased by P bias and N bias voltages. When $i_{ddtn}$ is low, the current through M bias 1 transistor 80 and M bias 2 transistor 81 is off because transistor 82 interconnecting the transistors is off. Transistor 83 is turned on to pull the node P bias high and shut off P channel transistors 76, 78 thereby preventing current flow through the first and second differential stages 72, 74. Node P1 is pulled to a high state by the $i_{ddtn}$ signal applied to inverter 86 and this turns transistor 88 on to pull node N13 down to zero volt. The N channel transistor of inverter 90 and the P channel transistor of inverter 92 are then turned off with the output Z being held at a low state. Consequently, no d.c. current is flowing. When the $i_{dd}$ test signal $i_{ddtn}$ is high, the operation is reversed and a circuit is in a normal operation condition.

The high speed driver circuit in accordance with the invention permits momentary feedback in the driver transistor by providing a single feedback transistor in the well structure of the semiconductor device thereby requiring less area in the circuit layout. A global set signal is provided to put the driver in a high Z state, and a global $i_{dd}$ test signal is provided to shut d.c. current in the receiver for $i_{dd}$ test.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A driver circuit comprising a driver transistor having a source, a gate, and a drain, a feedback transistor having a source, a gate, and a drain, said source being connected to said source of said driver transistor and said drain being connected to said gate of said driver transistor, an input terminal for receiving input signals, an output terminal connected to said source of said driver transistor and to said source of said feedback transistor, first conduction means for connecting said input terminal to said gate of said driver transistor, and second conduction means including delay circuitry for connecting said input terminal to said gate of said feedback transistor whereby a pulse transition on said input terminal turns-off said driver transistor, said turn-off being-delayed by momentary conduction of said feedback transistor.

2. The driver circuit as defined by claim 1 wherein said driver circuit is part of an integrated circuit fabricated in a semiconductor body, said driver transistor and said feedback transistor being fabricated in a doped well in said semiconductor body.

3. The driver circuit as defined by claim 2 wherein said first conduction means includes a first pass gate serially connected with a first inverter, and said second conduction means includes a second pass gate and a plurality of serially connected inverters connecting an output of said first inverter to bias terminals of said second pass gate.

4. The driver circuit as defined by claim 3 and further including an enable terminal for receiving a circuit enable/disable signal, third conduction means connecting said enable terminal to said first pass gate for controlling conduction of said first pass gate, and fourth conduction means responsive to said enable/disable signal for applying a bias voltage through said first inverter to said gate terminal of said driver transistor for rendering said driver transistor non-conductive when said driver circuit is disabled.

5. The driver circuit as defined by claim 4 and further including a clock input terminal for applying clock signals to activate said driver circuit, logic means receiving said enable/disable signal and said clock signals as inputs and providing clock signals as an output when said circuit is enabled, said clock signals controlling conduction of said first pass gate.

6. The driver circuit as defined by claim 2 and further including an enable terminal for receiving a circuit enable/disable signal, third conduction means connecting said enable terminal to said first conduction means for controlling conduction of said first conduction means, and fourth conduction means responsive to said enable/disable signal for applying a bias voltage through said first inverter to said gate terminal of said driver transistor for rendering said driver transistor non-conductive when said driver circuit is disabled.

7. The driver circuit as defined by claim 6 and further including a clock input terminal for applying clock signals to activate said driver circuit, logic means receiving said enable/disable signal and said clock signals as inputs and providing clock signals as an output when said circuit is enabled, said clock signals controlling conduction of said first conduction means.

8. The driver circuit as defined by claim 7 and further including an $i_{dd}$ test terminal for receiving a global signal to shut off all d.c. current for $i_{dd}$ testing, and circuit means connected with said $i_{dd}$ test terminal for disconnecting power to said driver circuit and for applying a ground potential to said source of said driver transistor.

9. The driver circuit as defined by claim 2 and further including an $i_{dd}$ test terminal for receiving a global signal to shut off all d.c. current for $i_{dd}$ testing and circuit means connected with said $i_{dd}$ test terminal for disconnecting power to said driver circuit and for applying a ground potential to said source of said driver transistor.

10. A driver circuit comprising a driver transistor having a source, a gate, and a drain, a feedback transistor having a source, a gate, and a drain, said source being connected to said source of said driver transistor and said drain being connected to said gate of said driver transistor, an input terminal for receiving input signals, an output terminal connected to said source of said driver transistor and to said source of said feedback transistor, a first conduction path for connecting said input terminal to said gate of said driver transistor, and a second conduction path including delay circuitry for connecting said input terminal to said gate of said feedback transistor whereby a pulse transition on said input terminal turns-off said driver transistor, said turn-off being delayed by momentary conduction of said feedback transistor.

11. The driver circuit as defined by claim 10 wherein said driver circuit is part of an integrated circuit fabricated in a semiconductor body, said driver transistor and said feedback transistor being fabricated in a doped well in said semiconductor body.

12. The driver circuit as defined by claim 11 wherein said first conduction path includes a first pass gate serially connected with a first inverter, and said second conduction path includes a second pass gate and a plurality of serially connected inverters connecting an output of said first inverter to bias terminals of said second pass gate.

13. The driver circuit as defined by claim 12 and further including an enable terminal for receiving a circuit enable/disable signal, a third conduction path connecting said enable terminal to said first pass gate for controlling conduction of said first pass gate, and a fourth conduction path responsive to said enable/disable signal for applying a bias voltage through said first inverter to said gate terminal of said driver transistor for rendering said driver transistor non-conductive when said driver circuit is disabled.

14. The driver circuit as defined by claim 13 and further including a clock input terminal for applying clock signals to activate said driver circuit, logic circuitry receiving said enable/disable signal and said clock signals as inputs and providing clock signals as an output when said circuit is enabled, said clock signals controlling conduction of said first pass gate.

15. In a driver circuit including a driver transistor having a source, a gate, and a drain formed in a doped well in a semiconductor body, a method of suppressing ringing when the driver transistor turns off comprising the step of a) providing a feedback transistor in said well, said feedback transistor having a source, a gate, and a drain, said source being connected to said source of said driver transistor and said drain being connected to said gate of said driver transistor, an output terminal connected to said source of said driver transistor and to said source of said feedback transistor, b) providing a first conduction path for connecting an input terminal to said gate of said driver transistor, and c) providing a second conduction path including delay circuitry for connecting said input terminal to said gate of said feedback transistor whereby a pulse transition on said input terminal turns-off said driver transistor, said turn-off being delayed by momentary conduction of said feedback transistor.

* * * * *